United States Patent
Dong

(10) Patent No.: US 7,575,972 B2
(45) Date of Patent: Aug. 18, 2009

(54) METHOD OF MANUFACTURING NONVOLATILE MEMORY DEVICE

(75) Inventor: Cha Deok Dong, Icheon-Si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 307 days.

(21) Appl. No.: 11/646,999

(22) Filed: Dec. 28, 2006

(65) Prior Publication Data

US 2008/0064164 A1    Mar. 13, 2008

(30) Foreign Application Priority Data

Sep. 13, 2006    (KR) .................. 10-2006-0088654

(51) Int. Cl.
    *H01L 21/336* (2006.01)
(52) U.S. Cl. .............. 438/257; 438/424; 257/315; 257/E21.687
(58) Field of Classification Search ......... 438/257, 438/424; 257/315, E21.687
    See application file for complete search history.

(56) References Cited

U.S. PATENT DOCUMENTS

2004/0126972 A1 * 7/2004 Dong et al. ............... 438/259

FOREIGN PATENT DOCUMENTS

| KR | 10-2001-0003086 | 1/2001 |
| KR | 10-2001-0064596 | 7/2001 |
| KR | 10-2002-0091984 | 12/2002 |
| KR | 10-2003-0094440 | 12/2003 |
| KR | 10-2005-0002102 | 1/2005 |
| KR | 10-2005-0108145 | 11/2005 |

* cited by examiner

*Primary Examiner*—Asok K Sarkar
*Assistant Examiner*—Julia Slutsker
(74) *Attorney, Agent, or Firm*—Marshall, Gerstein & Borun LLP

(57) ABSTRACT

A method of manufacturing a nonvolatile memory device is disclosed. The method includes the steps of forming a tunnel oxide layer, a first conductive layer for a floating gate, and a hard mask layer over a semiconductor substrate, etching a portion of the hard mask layer, the first conductive layer, the tunnel oxide layer and the semiconductor substrate, forming trenches, gap-filling the trenches with an insulating material to form isolation layers, removing the hard mask layer, forming second conductive layer for a floating gate on the entire surface, forming spacers on vertical faces of the second conductive layer, removing the second conductive layer on the isolation layers and between the spacers by means of an etch process using the spacers as etch masks, removing the spacers, and forming a dielectric layer and a third conductive layer on the entire surface including the second conductive layer. The method reduces the interference capacitance between neighboring word lines, minimizes the interference phenomenon, and minimizes the distributions of the program threshold voltage Vth between word lines.

15 Claims, 5 Drawing Sheets

METHOD OF MANUFACTURING NONVOLATILE MEMORY DEVICE

BACKGROUND OF THE INVENTION

The present invention relates to nonvolatile memory devices and, more particularly, to a method of manufacturing a nonvolatile memory device, which method can reduce the interference capacitance between neighboring word lines.

Information stored in the cells of a nonvolatile memory device is not lost when the power is off. The nonvolatile memory device includes a thin tunnel oxide layer, a floating gate, a control gate, and an insulator for isolating the two gates, which are formed over a silicon substrate.

FIG. 1 is a perspective view of a conventional NAND flash memory device.

Referring to FIG. 1, isolation layers 110 are formed by a Shallow Trench Isolation (STI) process, and define a field region and an active region. A tunnel oxide layer 120 is formed over a semiconductor substrate 100 in which the isolation layers 110 are formed. Floating gates 130 are formed on the tunnel oxide layer 120 to overlap with the edges of the isolation layers 110. Each floating gate 130 has a first conductive layer 130a and a second conductive layer 130b laminated thereon.

An Oxide-Nitride-Oxide (ONO) dielectric layer 140 and a control gate 150 are laminated on the floating gates 130, and over the isolation layer 110 between the floating gates 130.

At this time, a distance between neighboring word lines is reduced, and an opposing area (gate to gate) between neighboring floating gates between the respective word lines is increased, resulting in an interference capacitance $C_{FGY}$. The interference phenomenon becomes substantial due to the interference capacitance, making normal cell operation difficult.

FIG. 2 is a graph illustrating the difference in the distributions of a word line-based program threshold voltage Vth in the NAND flash memory device of FIG. 1.

From FIG. 2, the interference phenomenon between neighboring word lines for the outermost gate line (i.e., WL31) is relatively small and the threshold voltage distributions are therefore good for distributions of the word line-based program threshold voltage Vth in NAND flash memory having 32 strings. However, distributions of the threshold voltage Vth are very large due to the interference phenomenon in the X- and Y-directions, except for WL31.

Because it is preferable for NAND flash memory to have small distributions of the threshold voltage Vth, it is important to minimize the interference phenomenon as well as to secure the coupling ratio.

BRIEF SUMMARY OF THE INVENTION

An embodiment of the present invention is directed to a method of manufacturing a nonvolatile memory device, which method can overcome the interference phenomenon between neighboring word lines by reducing(for example, by an amount of at least about a half) the opposing area between floating gates in neighboring word lines by changing the shape of the floating gates.

In one embodiment, a method of manufacturing a nonvolatile memory device includes the steps of forming a tunnel oxide layer, a first conductive layer for a floating gate, and a hard mask layer over a semiconductor substrate, etching a portion of the hard mask layer, the first conductive layer, the tunnel oxide layer and the semiconductor substrate, thereby forming trenches, gap-filling the trenches with an insulating material to form isolation layers, removing the hard mask layer (thereby forming a projected portion of the isolation layers), forming a second conductive layer for a floating gate on the resulting surface, forming spacers on vertical faces of the second conductive layer, removing a portion of the second conductive layer on the isolation layers and between the spacers by means of an etch process using the spacers as etch masks, removing the spacers, and forming a dielectric layer and a third conductive layer on the resulting surface including the second conductive layer.

DESCRIPTION OF SPECIFIC EMBODIMENTS

Specific embodiments according to the present disclosure are described with reference to the accompanying drawings.

Figure 1:
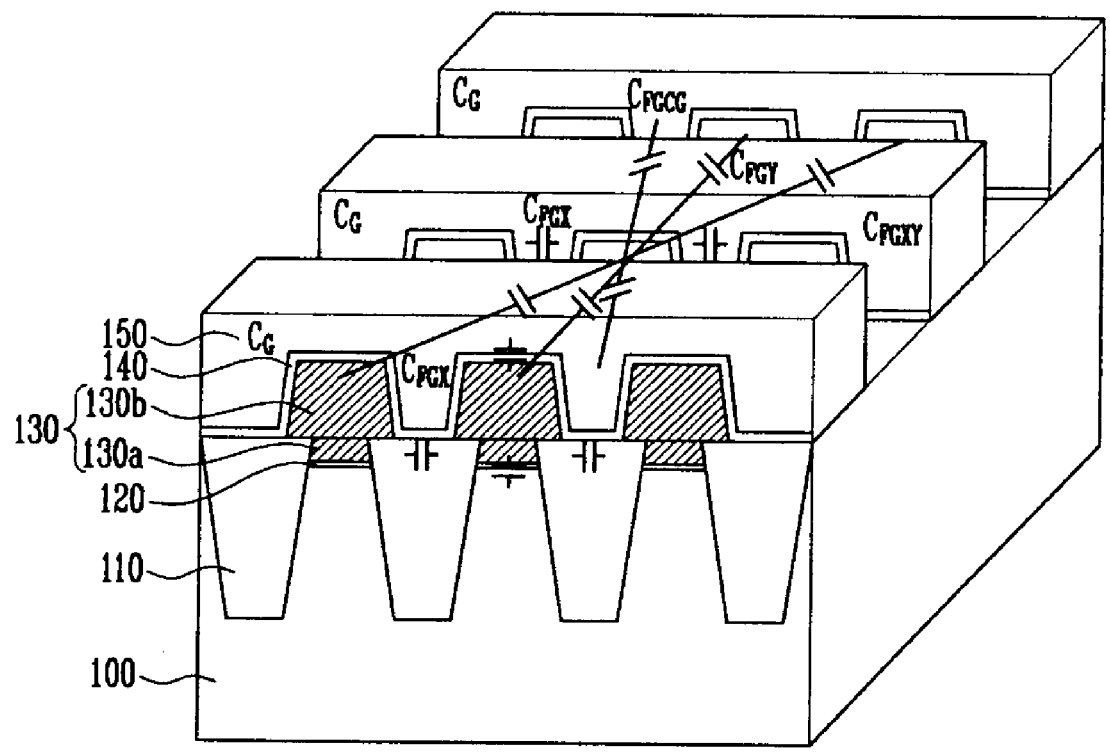
FIG. 1 is a perspective view of a conventional NAND flash memory device.
Figure 2:
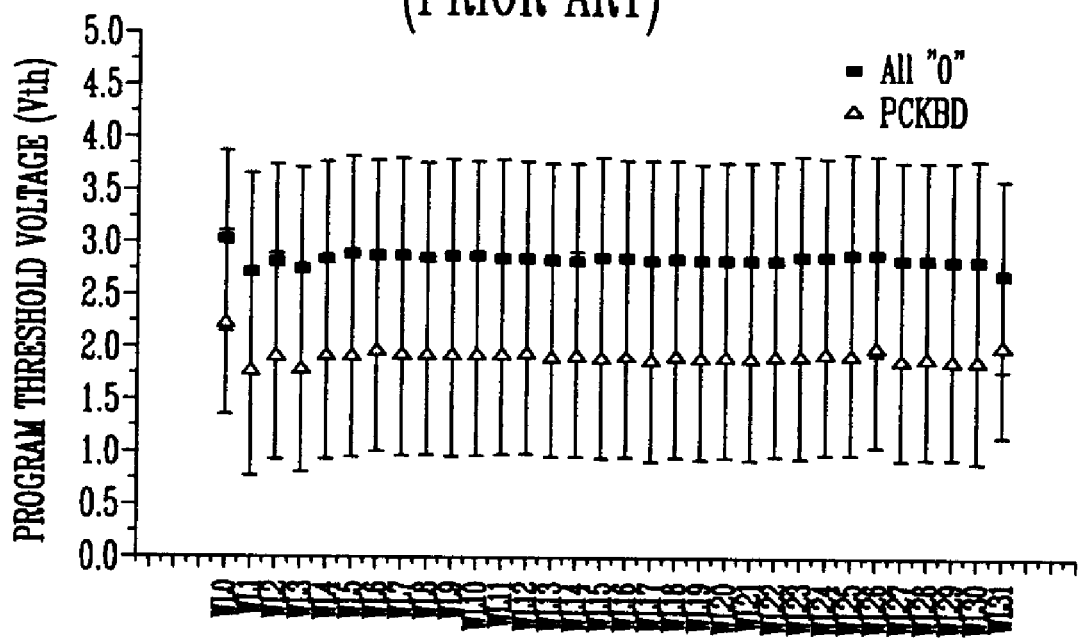
FIG. 2 is a graph illustrating the difference in the distributions of a word line-based program threshold voltage Vth in the NAND flash memory device of FIG. 1.
Figure 3A:
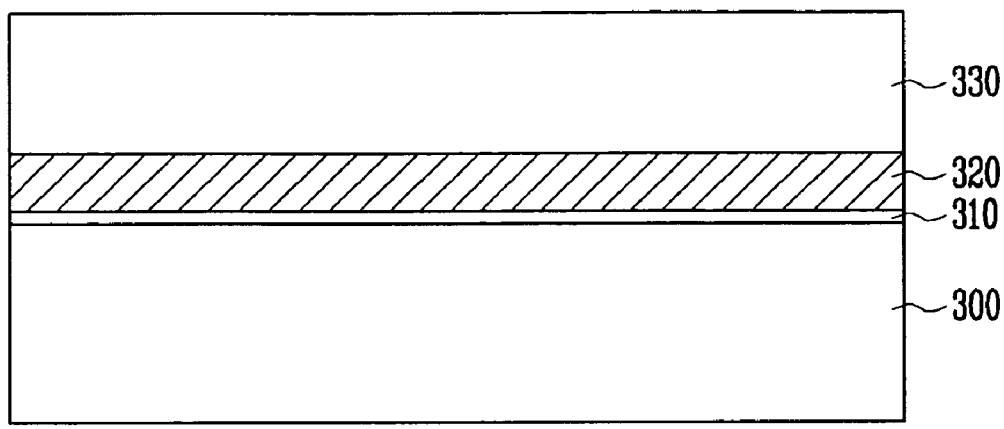
FIGS. 3A to 3J are cross-sectional views illustrating a method of manufacturing a nonvolatile memory device according to an embodiment of the present invention.

Referring to FIG. 3A, a tunnel oxide layer 310, a first conductive layer 320 for a floating gate, and a hard mask layer 330 are sequentially formed over a semiconductor substrate 300.

The tunnel oxide layer 310 can be formed from silicon oxide ($SiO_2$) using an oxidation process.

The first conductive layer 320 can be formed from a polysilicon layer or a metal layer. Preferably, the first conductive layer 320 is formed using a polysilicon layer with a good surface adhesive property. Furthermore, the first conductive layer 320 can be formed by chemical vapor deposition (CVD) or physical vapor deposition (PVD), preferably by low pressure CVD (LPCVD).

The hard mask layer 330 is formed from a material with an etch selectivity different from that of the first conductive layer 320. Preferably, the hard mask layer 330 is formed from a nitride-based material (hereinafter a "nitride layer"), such as $Si_xN_y$ or SiON, or a stacked structure including a buffer oxide layer and a nitride layer. The hard mask layer 330 can be formed by CVD, preferably by LPCVD.

In this case, the buffer oxide layer serves to prevent the first conductive layer 320 from being lost in the process of etching the nitride layer in a subsequent process. The buffer oxide layer can have a thickness of 30 Å to 100 Å.

Figure 3B:
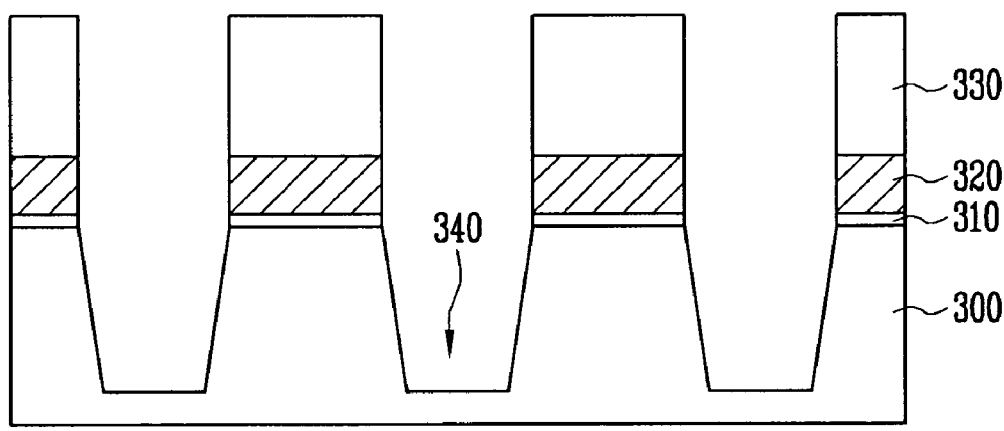

Referring to FIG. 3B, specific regions of the hard mask layer 330, the first conductive layer 320, the tunnel oxide layer 310 and the semiconductor substrate 300 are etched to form trenches 340 in the isolation region of the semiconductor substrate 300. The trenches 340 are preferably formed in the semiconductor substrate 300 using a self-aligned shallow trench isolation (SA-STI) process.

The critical dimension (CD) of the hard mask layer 330 ranges from 50 nm to 60 nm, and is preferably set a level much smaller than 50 nm to 60 nm when forming highly integrated devices. Thus, the width of the trench 340 is also set in the range of 50 nm to 60 nm.

Figure 3C:
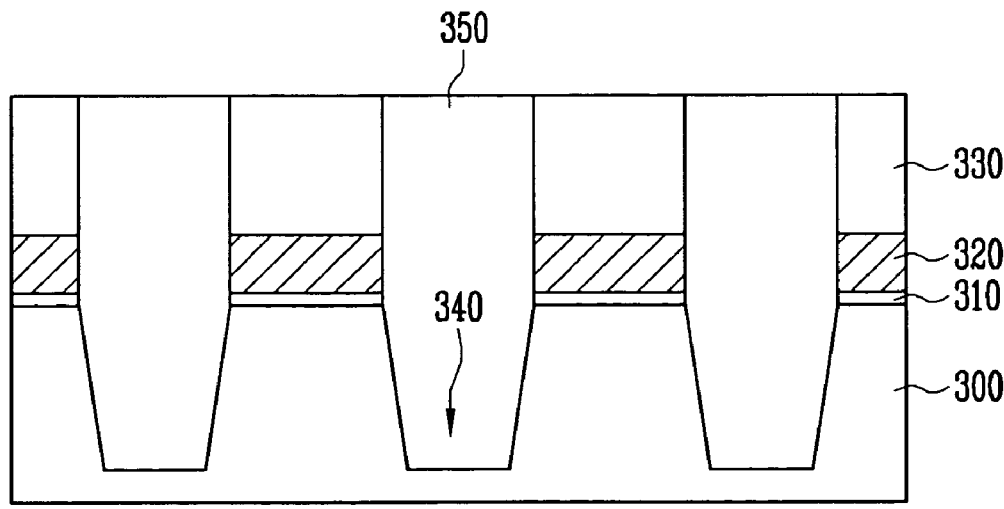

Referring to FIG. 3C, a gap-fill oxide layer for gap-filling the trenches 340 is deposited on the entire surface. The gap-fill oxide layer is polished until the surface of the hard mask layer 330 is exposed, thus forming isolation layers 350 on the trenches 340 in the isolation region.

The gap-fill oxide layer can be formed by CVD employing any one selected from a group comprising Spin On Glass (SOG), Undoped Silicate Glass (USG), Boron-Phosphorus Silicate Glass (BPSG), Phosphorus Silicate Glass (PSG), Plasma Enhanced Tetra Ortho Silicate Glass (PETEOS) and Inter Poly Oxide (IPO). The polishing process can be a chemical mechanical polishing (CMP) process.

In this case, a sidewall oxidization process for healing damage generated by the etch process when the trenches 340 are formed can be performed before the gap-fill oxide layer for gap-filling the trenches 340 is deposited. Furthermore, to improve the gap-fill characteristic of the gap-fill oxide layer, a liner oxide layer (not shown) may be further formed on the sidewalls of the hard mask layer 330, the first conductive layer 320 and the tunnel oxide layer 310 and within the trenches 340.

Figure 3D:
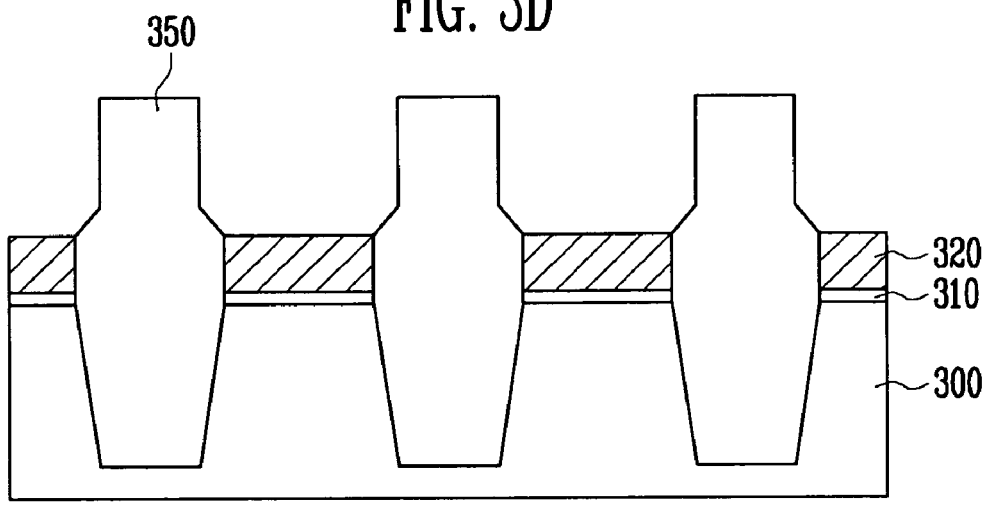

Referring to FIG. 3D, the hard mask layer 330 is removed. Thus, the top surface of the first conductive layer 320 is exposed, and the tops of the isolation layers 350 are projected higher than the first conductive layer 320. The hard mask layer 330 can be removed by a dip-out process employing a phosphoric acid solution ($H_3PO_4$).

After the hard mask layer 330 is removed, cleaning can be further performed to reduce the width of the isolation layers 350 projecting above the first conductive layer 320, as illustrated in FIG. 3D. The cleaning process can use buffer oxide etchant (BOE) or an HF solution. It is therefore possible to secure a CD wider than the CD that is otherwise obtained by the trench formation process illustrated in FIG. 3B.

Figure 3E:
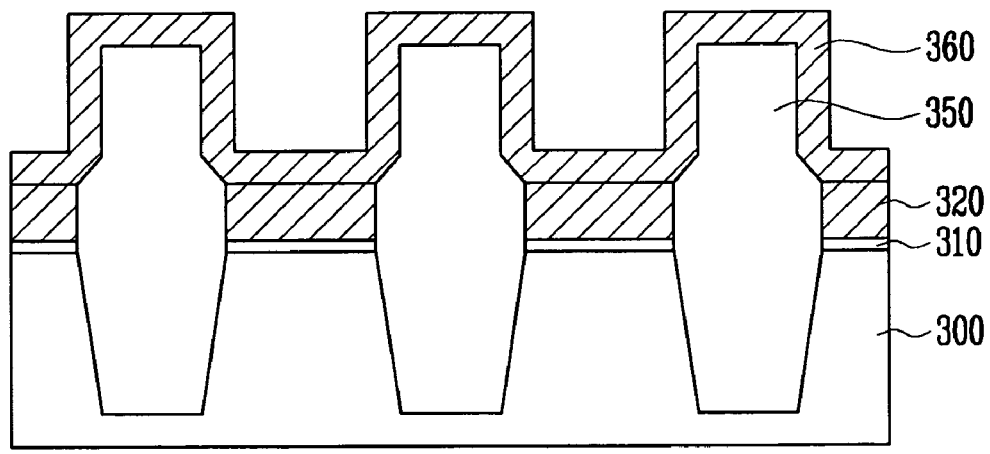

Referring to FIG. 3E, a second conductive layer 360 for a floating gate is formed on the entire surface including the projected isolation layers 350.

The second conductive layer 360 can be formed using a polysilicon layer or a metal layer, and is preferably a polysilicon layer. The second conductive layer 360 can be formed by CVD or PVD.

The second conductive layer 360 has a thickness of ⅙ to ¼ the thickness of the CD, which is defined as the distance between the projected isolation layers 350. If the second conductive layer 360 is thickly deposited, there is insufficient space to form an insulating layer for a spacer in a subsequent process. Thus, it is preferable to control the thickness of the second conductive layer 360 considering the above.

Figure 3F:
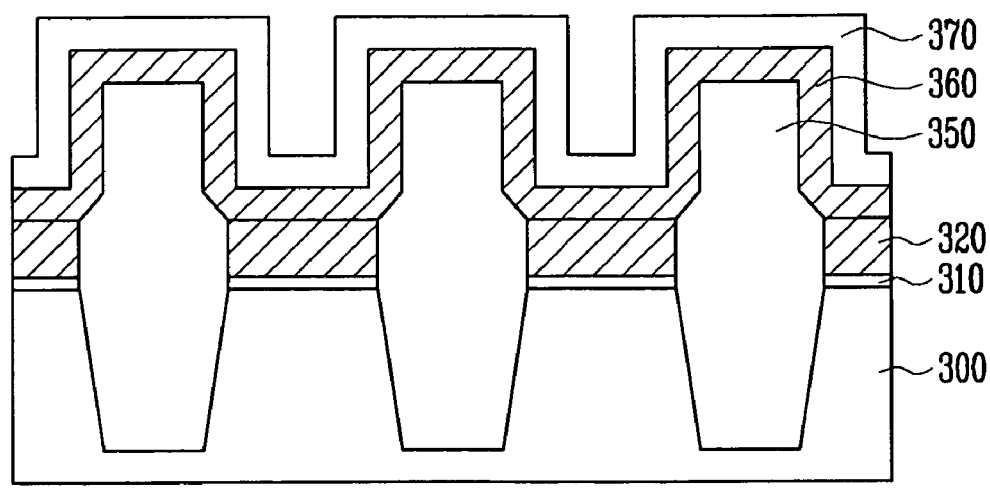

Referring to FIG. 3F, an insulating layer 370 for a spacer is formed on the second conductive layer 360. The insulating layer 370 is deposited to form the spacer in a subsequent process, and can be formed from silicon oxide ($SiO_2$) or silicon nitride ($Si_xN_y$ or SiON).

The insulating layer 370 has a thickness of ¼ to ⅓ of the space remaining between the projected isolation layers 350 after the second conductive layer 360 is formed. This is because a portion of the surface of the second conductive layer 360 can be sufficiently exposed between the spacers on the first conductive layer 320 even after the spacer is formed using the insulating layer 370.

Figure 3G:
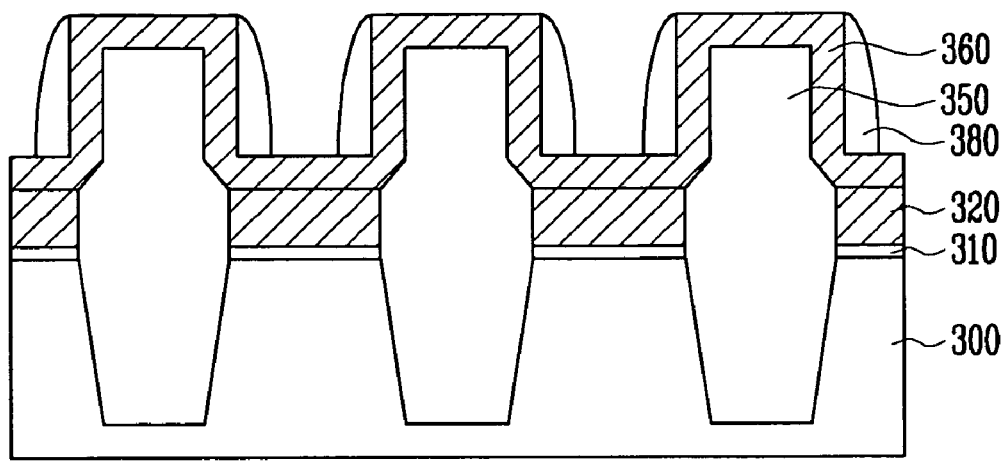

Referring to FIG. 3G, a portion of the insulating layer 370 is etched to form spacers 380 through which a portion of the surface of the second conductive layer 360 is exposed.

The spacers 380 can be formed by performing dry etch on the insulating layer 370. Accordingly, the surface of the second conductive layer 360 is exposed in regions other than the regions in which the spacers 380 are formed.

Figure 3H:
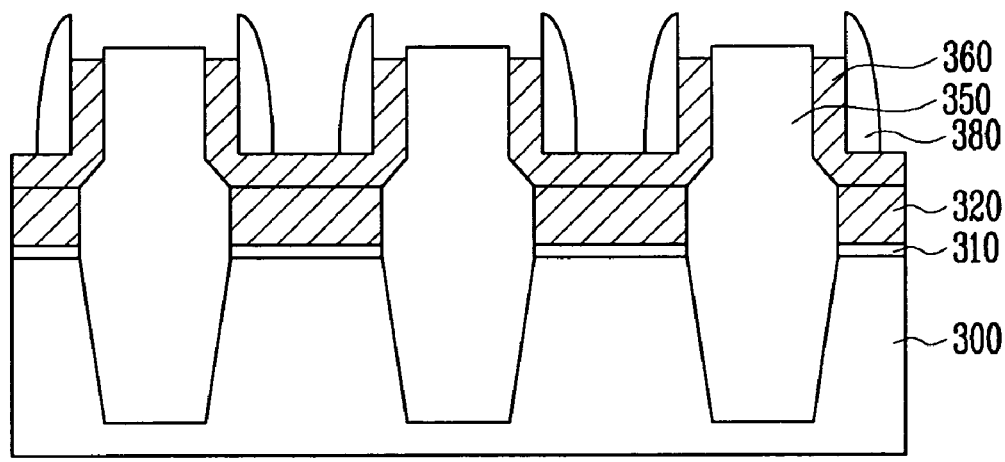

Referring to FIG. 3H, the second conductive layer 360 is etched by an etch process using the spacers 380 as etch masks. Thus, a portion of the second conductive layer 360 on the isolation layers 350 and on the first conductive layer 320 between the spacers 380 is removed. At this time, the second conductive layer 360 formed on the projected sidewalls of the isolation layers 350 has a vertical thickness that is relatively thick. The second conductive layer 360 can be removed by an etch-back process. Preferably, the second conductive layer 360 is removed by a blanket etch-back process.

At the time of the etch-back process, a target etch thickness can be set thicker than the thickness of the second conductive layer 360 in order to etch the first conductive layer 320 to a specific thickness.

In this case, the first conductive layer 320 has a U-shaped (⊔) form. The second conductive layer 360 has L-shaped forms (⌊ and ⌋) and is formed at both ends on the first conductive layer 320.

Therefore, by forming the first and second conductive layers 320 and 360 to have the above forms, an opposing area (gate to gate) between the floating gates of neighboring word lines can be reduced by a fraction of at least about a half compared with the prior art. Furthermore, the top of the second conductive layer 360 has a square shape, not a pointed shape, thereby preventing the concentration of an electric field.

As described above, according to the present-invention, the etch-back process is performed on the polysilicon layer 360 in order to define the top of the floating gate. Accordingly, cells can be stably formed because structures without pointed tips can be obtained.

Figure 3I:
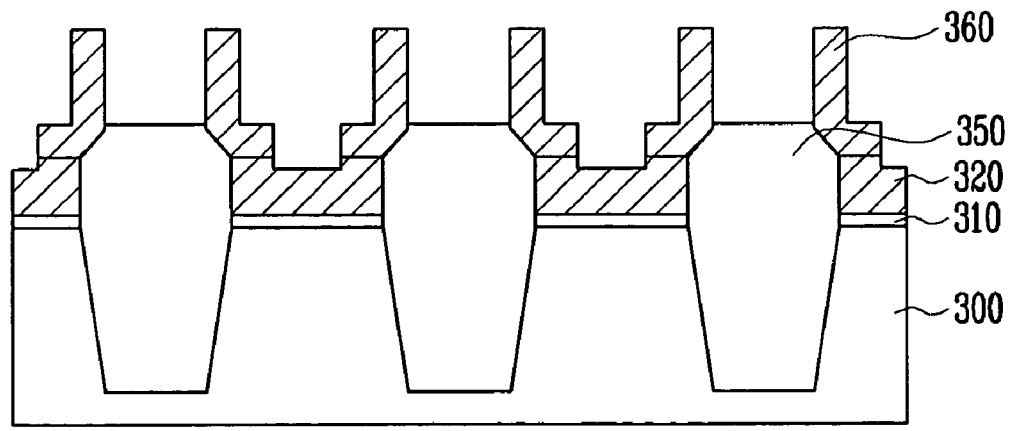

Referring to FIG. 3I, before a dielectric layer (not shown) is deposited, the spacer 380 is fully removed by a cleaning process. The projections of the isolation layers 350 are also removed to a specific thickness, thereby exposing the outer wall of the second conductive layer 360. By exposing the outer wall of the second conductive layer 360, the coupling ratio with a control gate to be formed in a subsequent process can be increased.

In this case, in the case where the spacers 380 are formed of silicon oxide, the isolation layers 350 are etched to a specific thickness when the spacers 380 are removed. In contrast, in the case where the spacer 380 is formed of silicon nitride, the spacers 380 are first removed by a phosphoric acid solution ($H_3PO_4$) and the isolation layers 350 are then etched to a specific thickness using a BOE or HF solution, thus exposing the outer wall of the second conductive layer 360.

Figure 3J:
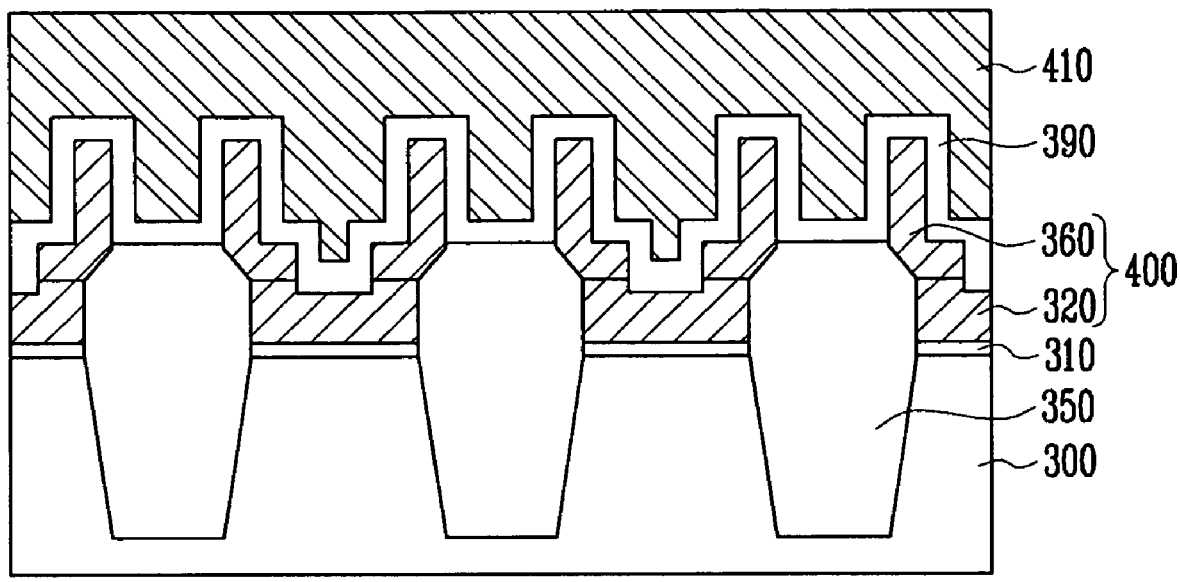

Referring to FIG. 3J, a dielectric layer 390 is formed on the entire surface including the second conductive layer 360. The dielectric layer 390 can be formed from oxide-nitride-oxide (ONO). The dielectric layer 390 can be formed by CVD, preferably by LPCVD.

A third conductive layer 410 for a control gate is formed on the dielectric layer 390. The third conductive layer 410 can be formed from a polysilicon layer, a metal layer, or a stacked structure of the two materials. The third conductive layer 410 can be formed by CVD or PVD.

Thereafter, the third conductive layer, the dielectric layer 390, the second conductive layer 360 and the first conductive layer 320 are sequentially patterned by general processes known in the art. Thus, a floating gate 400 including the first and second conductive layers 320 and 360, and a control gate including the third conductive layer 410 are formed.

As described above, according to the present invention, the shape of the floating gate is changed so that the first conductive layer has a U-shaped form, and the second conductive layer has L-shaped forms at both ends of the first conductive layer.

The opposing area (gate to gate) between the floating gates of neighboring word lines is reduced by a fraction of at least about a half compared with the prior art by changing the shape of the floating gate. It is therefore possible to reduce the interference capacitance between neighboring word lines, to minimize the interference phenomenon, and to minimize the distributions of the program threshold voltage Vth between word lines.

As described above, according to the present invention, the coupling ratio of the floating gate and the control gate can be increased by changing the shape of the floating gate. It is therefore possible to lower an operating voltage or improve the program/erase speed.

Furthermore, the coupling ratio can be improved using the existing dielectric layer even without using an expensive high-k material, which can secure the coupling ratio while the thickness of the physical oxide layer is decreased. It is therefore possible to reduce the cost while improving the reliability of the final products.

Furthermore, according to the present invention, a process can be sufficiently performed using the existing process even without investing additional equipment accompanied by an increased level of integration. Further, the process margin can be easily secured, and productivity can be improved.

The above embodiments of the present invention are illustrative and not limiting. Various alternatives and equivalents are possible. Other additions, subtractions, or modifications that are obvious in view of the present disclosure are intended to fall within the scope of the appended claims.

What is claimed is:

1. A method of manufacturing a nonvolatile memory device, comprising the steps of:
    (a) forming a tunnel oxide layer, a first conductive layer for a floating gate, and a hard mask layer over a semiconductor substrate;
    (b) etching a portion of the hard mask layer, the first conductive layer, the tunnel oxide layer and the semiconductor substrate, thereby forming trenches;
    (c) gap-filling the trenches with an insulating material to form isolation layers;
    (d) removing the hard mask layer, thereby forming a projected portion of the isolation layers;
    (e) forming a second conductive layer for a floating gate on the surface resulting from step (d);
    (f) forming spacers on vertical faces of the second conductive layer;
    (g) removing a portion of the second conductive layer on the isolation layers and between the spacers by means of an etch process using the spacers as etch masks;
    (h) removing the spacers; and,
    (i) forming a dielectric layer and a third conductive layer on the surface resulting from step (h), including the second conductive layer.

2. The method of claim 1, wherein a critical dimension (CD) of the etched hard mask layer ranges from 50 nm to 60 nm.

3. The method of claim 1, wherein the hard mask layer comprises a nitride layer.

4. The method of claim 3, wherein the hard mask further comprises a buffer oxide layer stacked with the nitride layer.

5. The method of claim 1, wherein the hard mask layer is removed using a dip-out process employing a phosphoric acid solution.

6. The method of claim 1, wherein the second conductive layer has a thickness of $\frac{1}{6}$ to $\frac{1}{4}$ of a CD between the projected portion of the isolation layers.

7. The method of claim 1, wherein the spacers have a thickness of $\frac{1}{4}$ to $\frac{1}{3}$ of the distance between the projected portion of the isolation layers after the second conductive layer is formed.

8. The method of claim 1, wherein the spacers are formed from at least one of a silicon oxide layer and a silicon nitride layer.

9. The method of claim 1, wherein the etch process of step (g) further comprises etching the first conductive layer into a U-shaped portion.

10. The method of claim 1, wherein the etch process of step (g) further comprises etching the second conductive layer into L-shaped portions.

11. The method of claim 1, further comprising the step of removing the isolation layers to a specified thickness, thereby exposing outer walls of the second conductive layer.

12. The method of claim 11, wherein the spacers are formed from a nitride layer and the isolation layers are removed using a buffer oxide etchant (BOE) or an HF solution after the spacers are removed by a dip-out process employing a phosphoric acid solution.

13. The method of claim 1, further comprising the step of cleaning using a BOE or an HF solution after step (d).

14. The method of claim 1, wherein step (b) further comprises performing an oxidization process for healing etch damage on the entire surface including the trenches.

15. The method of claim 1, wherein step (b) further comprises forming a liner oxide layer for improving a trench gap-fill characteristic on the entire surface including the trenches.

* * * * *